US009184026B2

(12) United States Patent
Wieland

(10) Patent No.: US 9,184,026 B2
(45) Date of Patent: Nov. 10, 2015

(54) PROXIMITY EFFECT CORRECTION IN A CHARGED PARTICLE LITHOGRAPHY SYSTEM

(71) Applicant: Mapper Lithography IP B.V., Delft (NL)

(72) Inventor: Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/626,891

(22) Filed: Feb. 19, 2015

(65) Prior Publication Data
US 2015/0243481 A1 Aug. 27, 2015

Related U.S. Application Data

(60) Provisional application No. 61/942,676, filed on Feb. 21, 2014.

(51) Int. Cl.
| | |
|---|---|
| *H01J 37/30* | (2006.01) |
| *H01J 37/302* | (2006.01) |
| *G21K 5/04* | (2006.01) |

(Continued)

(52) U.S. Cl.
CPC .......... *H01J 37/3174* (2013.01); *H01J 37/045* (2013.01); *H01J 37/3007* (2013.01); *H01J 2237/043* (2013.01); *H01J 2237/31715* (2013.01)

(58) Field of Classification Search
CPC .................. H01J 37/3174; H01J 2237/31769; H01J 2237/31761; H01J 37/3026; G03F 7/2061

USPC .......... 250/492.22, 492.2, 492.3, 307, 252.1; 430/296, 942
See application file for complete search history.

(56) References Cited

U.S. PATENT DOCUMENTS

| | | |
|---|---|---|
| 5,736,281 A | 4/1998 | Watson |
| 5,847,959 A | 12/1998 | Veneklasen |

(Continued)

OTHER PUBLICATIONS

Brandt, P., et al., "Demonstration of EDA Flow for Massively Parallel e-Beam Lithography," *Alternative Lithographic Technologies VI*, *Proc. of SPIE*, vol. 9049, 904915, DOI: 10.1117/12.2046091, 2014, pp. 1-17.

Brunner, T., et al., "Impact of Resist Blur on MEF, OPC and CD Control," *Optical Microlithography XVII Proc. of SPIE*, vol. 5377, DOI: 10.1117/12.537472, 2014, pp. 141-149.

(Continued)

*Primary Examiner* — Nikita Wells
(74) *Attorney, Agent, or Firm* — Blakely Sokoloff Taylor & Zafman LLP

(57) ABSTRACT

The invention relates to a method for performing charged particle beam proximity effect correction, comprising the steps of: receiving a digital layout pattern to be patterned onto a target using one or more charged particle beams; selecting a base proximity function comprising a sum of an alpha and a beta proximity function, wherein said alpha proximity function models a short range proximity effect and said beta proximity function models a long range proximity effect, wherein a constant $\eta$ is defined as a ratio between the beta proximity function and the alpha proximity function in said sum, with $0<\eta<1$;
determining a modified proximity function which corresponds to said base proximity effect function wherein the alpha proximity function has been replaced by a Dirac delta function, and
using an electronic processor, performing a deconvolution of the digital layout pattern with the modified proximity function to produce a corrected layout pattern.

20 Claims, 10 Drawing Sheets

(51) Int. Cl.
*H01J 37/317* (2006.01)
*H01J 37/04* (2006.01)

(56) References Cited

U.S. PATENT DOCUMENTS

| | | | |
|---|---|---|---|
| 5,863,682 A | 1/1999 | Abe et al. | |
| 7,256,870 B2 | 8/2007 | Finders | |
| 7,638,247 B2 | 12/2009 | Belic et al. | |
| 2005/0273753 A1 | 12/2005 | Sezginer | |
| 2005/0287450 A1 | 12/2005 | Hudek et al. | |
| 2006/0269875 A1 | 11/2006 | Granik | |
| 2007/0114453 A1* | 5/2007 | Emi et al. | 250/492.2 |
| 2007/0194250 A1* | 8/2007 | Suzuki et al. | 250/492.2 |
| 2009/0057575 A1* | 3/2009 | Oogi et al. | 250/492.22 |
| 2012/0042291 A1 | 2/2012 | Granik et al. | |
| 2012/0061593 A1* | 3/2012 | Kawase | 250/492.3 |
| 2012/0293787 A1 | 11/2012 | Galler | |
| 2013/0201468 A1 | 8/2013 | Manakli | |
| 2014/0138527 A1* | 5/2014 | Kato et al. | 250/252.1 |

OTHER PUBLICATIONS

Choi, J., et al., "Electron Scattering Analysis Based on Electron Ray-Tracing in Extreme Ultraviolet Photomask," *J. Vac. Sci Technol*,. B 32(4), DOI: 10.1116/1.4878943, 2014, pp. 1-9.

Galler, R., et al., "Geometrically Induced Dose Correction Method for e-Beam Lithograpy Applications," *Photomask Technology 2010, Proc. of SPIE*, vol. 7823, DOI: 10.1117/12.864263, 2010, pp. 1-9.

Leen, T.K., "Theory and Practice of Proximity Correction by Secondary Exposure," *J. Appl. Phys*., 65(4), DOI: 10.1063/1.342904, 1989, pp. 1776-1781.

Van Steenwinckel, D., et al., "Lithographic Importance of Acid Diffusion in Chemically Amplified Resists," *Advances in Resist Technology and Processing XXII, Proc. of SPIE*, vol. 5753, DOI:10.1117/12.598677, 2005, pp. 269-280.

Yu, P., et al., "A Novel Intensity Based Optical Proximity Correction Algorithm with Speedup in Lithography Simulation," The Department of Electrical and Computer Engineering, The University of Texas at Austin, 2007 *IEEE*, p. 854-859.

Wuest, R., et al., "Limitations of Proximity-Effect Correction for Electron-Beam Patterning of Photonic Crystals," *Proc. of SPIE*, vol. 5277 (2004), p. 186-197.

Brandt, P. et al. "Demonstration of EDA flow for massively parallel e-beam lithography" Proceedings of SPIE, vol. 9049, International Society for Optical Engineering, US, (Mar. 28, 2014), 18 pages.

Groves, T. R. "Efficiency of electron-beam proximity effect correction" Journal of Vacuum Science and Technology: Part B, vol. 11, No. 6, AVS/AIP, Melville, New York, NY, US, (Nov. 1, 1993), 8 pages.

\* cited by examiner

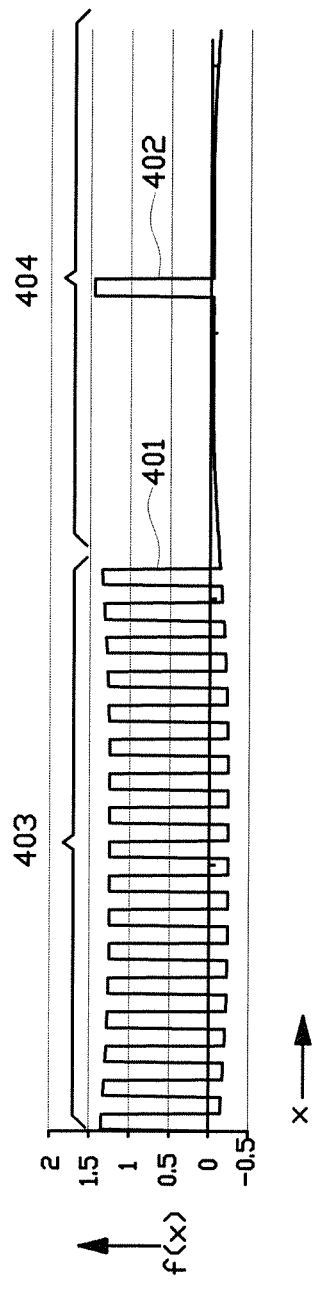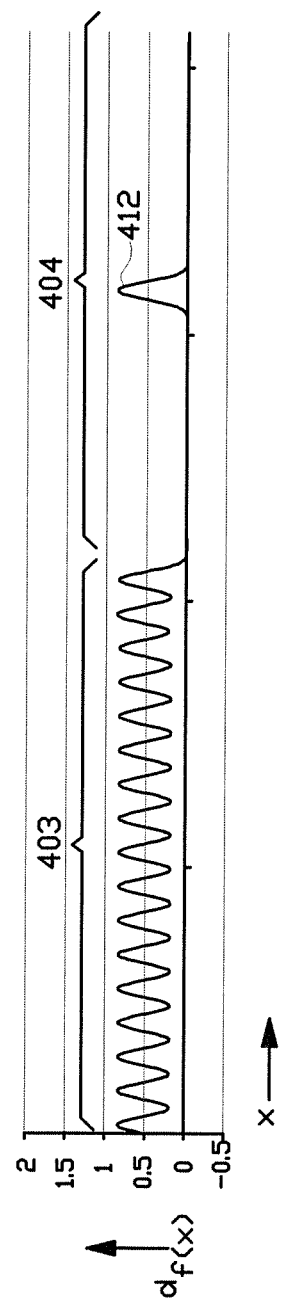

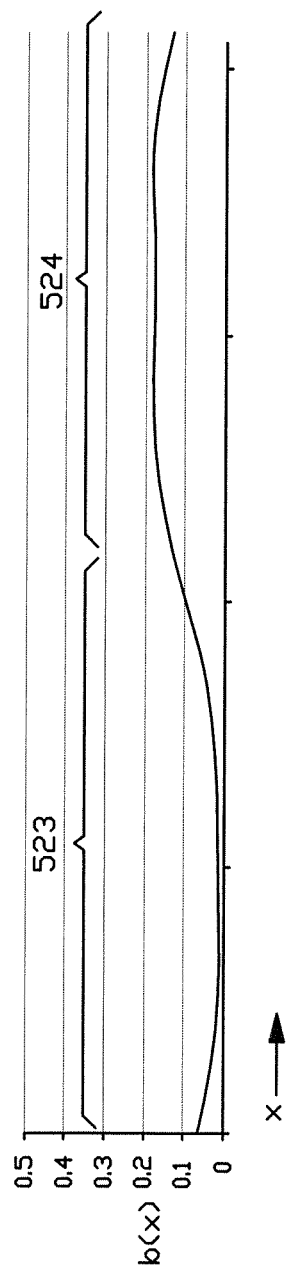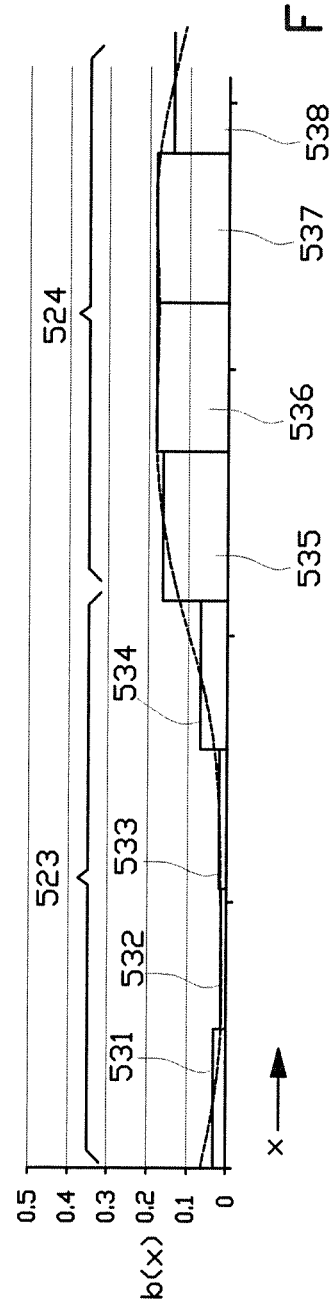

PROXIMITY EFFECT CORRECTION IN A CHARGED PARTICLE LITHOGRAPHY SYSTEM

BACKGROUND

The invention relates to a method for proximity effect correction, e.g. as may be performed in a charged particle lithography system. Typically, in a charged particle beam lithography system at least one beam of charged particles is directed onto a resist-layer of a wafer to form a desired pattern in the resist. The achievable pattern resolution within the resist depends on how well the spatial charged particle energy deposition can be controlled within the resist. When a charged particle beam is directed onto a position on a substrate which is coated with resist, some of the incident charged particles are scattered on their trajectories through the resist.

In forward scattering, a charged particle of the beam of charged particles may collide with an electron of the substrate or the resist. This causes the charged particle to be deflected from its trajectory and to deposit part of its energy in the substrate or resist.

The charged particles may also collide with a nucleus of an atom in the substrate or resist, resulting in a substantially elastic backscattering event which causes the charged particle to be deflected to a much greater extent than it would be when colliding with an electron.

Due to forward scattering and backscattering of the charged particles, the actual dose, or energy deposition, and thus the developed pattern, is wider than the desired pattern scanned by the charged particle beam on the surface of the resist. This phenomenon is called the proximity effect. When modelling the proximity effect typically use is made of a point spread function, which is often referred to as a proximity effect function. The point spread function depends on factors such as the materials of the target and the resist used, resist thickness, the primary beam energy and/or the development process used for developing the resist. When these factors are known, a corresponding point spread function may be calculated without empirically determining the point spread function. Alternatively the point spread function may be estimated using empirical methods, an brief overview of which is given in the article "Experimental study of proximity effect corrections in electron beam lithography", Jianguo Zhu et al., Proc. SPIE vol. 2437, Electron-Beam, X-Ray, EUV, and Ion-Beam Submicrometer Lithographies for Manufacturing V, pg. 375 (May 19, 1995); doi: 10.1117/12.209175.

U.S. Pat. No. 7,638,247 B2, which is incorporated herein by reference, describes a method for performing an electron beam proximity correction process in which both a short range (caused by forward scattering) and a long range (caused by backscattering) proximity effect correction is carried out on a received layout, wherein a dose value is formulated for each feature using the results of both the short range and the long range proximity effect corrections. In an embodiment, the long range proximity effect correction is carried out using a grid-based deconvolution method.

Applicant has found that when the received layout contains high spatial frequencies, e.g. contains very small features, known methods which make use of deconvolution or approximations thereof are susceptible to errors which lead to undesired variations in the calculated value of the dose which is to be delivered to the resist. It is an object of the present invention to provide an improved method for charged particle beam proximity effect correction.

SUMMARY OF THE INVENTION

To this end, according to a first aspect, the present invention provides a method for performing a charged particle beam proximity effect correction process, said method comprising the steps of: receiving a digital layout of a pattern to be patterned onto a target using one or more charged particle beams; selecting a base proximity effect function comprising a sum of an alpha proximity effect function and a beta proximity effect function, wherein said alpha proximity effect function models a short range proximity effect and said beta proximity effect function models a long range proximity effect, wherein a constant $\eta$ is defined as a ratio between the beta proximity effect function and the alpha proximity effect function in said sum, preferably with $0<\eta<1$; wherein said method comprises the steps of: determining a modified proximity effect function which corresponds to said base proximity effect function wherein the alpha proximity effect function has been replaced by a Dirac delta function; using an electronic processor, producing a corrected layout pattern based on a deconvolution of the digital layout pattern with the modified proximity effect function. The corrected layout pattern may thus define a dose value to be assigned to each feature for patterning said feature on a target such as a wafer. Preferably, the target, in particular a substrate which is provided with a resist thereon, is patterned by one or more charged particle beams of a charged particle lithography system which are modulated based on said corrected layout pattern.

The purpose of proximity correction is to determine a corrected layout pattern such that when a target is exposed to the corrected layout pattern, the resulting pattern formed on the target after development at an exposure threshold level resembles the digital layout pattern as closely as possible. In general, a corrected layout pattern cannot be determined analytically from the exposed pattern and the base proximity effect function because the exposed pattern which is formed on the target is a somewhat blurred version of the digital layout pattern and lacks information on high frequency components that may have been present in the digit layout. Conventional techniques for numerically approximating a corrected layout pattern suffer from numerical instability when high frequency components, e.g. densely spaced features such as lines or contacts, are present in the digital layout pattern. When these conventional techniques are used, the high frequency components may be calculated incorrectly or omitted from the corrected layout pattern altogether, as a result of which the high frequency components of the digital layout pattern may not be transferred correctly onto the target.

For reasons of conciseness, the alpha proximity effect function, the beta proximity effect function, the base proximity effect function and/or the modified proximity effect function may herein also be referred to as the alpha proximity function, the beta proximity function, the base proximity function and the modified proximity function respectively.

According to the method of the present invention the corrected layout pattern is calculated based on deconvolution of the digital layout pattern with the modified proximity effect function instead of with the base proximity effect function, so that negative influences of high frequency components in the digital layout pattern on the numerical stability during calculation of said deconvolution are substantially reduced. As a result, a more constant and accurate corrected layout pattern may be obtained.

The base proximity effect function is preferably defined as a scalar times the sum of said alpha and beta proximity effect functions, plus or minus a constant, wherein the alpha and beta proximity effect functions are typically Gaussian functions. For example, given a received digital layout $p(x,y)$ which describes a spatial pattern of a layout to be transferred to a resist, a suitable base proximity effect function may be defined as:

$$h(r) = \frac{1}{(1+\eta)}(g_\alpha(r) + \eta g_\beta(r))$$

wherein r is the distance of a charged particle beam when incident on the resist to position (x,y), wherein $g_\alpha(r)$ and $g_\beta(r)$ are Gaussian functions with $\beta \gg \alpha$, and wherein $\alpha$ and $\beta$ can be substituted for $\sigma$ in $$g_\sigma(r) = \frac{1}{\pi\sigma^2} e^{\frac{-r^2}{\sigma^2}}.$$

The actual dose d(x,y) delivered to a position (x,y) in the resist may then be modelled as:

$$d(x,y) = h(r) \otimes p(x,y)$$

wherein ⊗ is the convolution operator.

If a two-dimensional plot of the dose function d(x,y) were made, this plot would seem like a blurred version of a two-dimensional plot of the received layout p(x,y). Obviously, it is desirable that the dose applied to the resist corresponds as much as possible to the received layout, and that blurring of the actual dose-pattern delivered to the resist as compared to the received layout pattern is avoided as much as possible.

A corrected layout pattern f(x,y) may be determined which compensates for the proximity effect, by solving f(x,y) for:

$$p(x,y) = f(x,y) \otimes h(r)$$

In other words, f(x,y) can be obtained by deconvolution of p(x,y) by h(r). This corrected layout pattern f(x,y) can be thought of as a dosage pattern to be used for patterning the target which compensates at least partially for the proximity effect.

Typically, when deconvolution is carried out over large amounts of data, it is performed in the Fourier domain, e.g. by solving F(u,v) for:

$$P(u,v) = F(u,v) * H(k)$$

i.e. by solving:

$$F(u,v) = P(u,v)/H(k),$$

wherein F(u,v), P(u,v) and H(k) are the Fourier transforms of f(x,y), p(x,y) and h(r) respectively.

As spatial frequencies increase (i.e. the value of k increases, for instance when features are at distributed a close pitch to each other), the term H(k) rapidly approaches zero. In particular when F(u,v) is computed using finite precision arithmetic, as is typically the case when the calculations are performed using an electronic processor, this may result in undefined behavior due to division by zero and/or may result in numerical instability in the calculated values of F(u,v), which affects the accuracy of the resulting corrected layout pattern.

The method of the present invention substantially solves this problem by replacing the alpha-proximity effect function in the base proximity effect function h(r) with the Dirac delta-function, resulting in a modified proximity effect function. For the base proximity effect function h(r) above the modified proximity effect function $h_m(r)$ is thus:

$$h_m(r) = \frac{1}{1+\eta}(\delta(r) + \eta \cdot g_\beta(r))$$

and the Fourier transform of the modified proximity effect function is:

$$H_m(k) = 1 + \eta \cdot G_\beta(k)$$

which evaluates to values that are greater than or equal to 1, independent of the spatial resolution of the layout pattern p(x,y) or the value of $\alpha$ or $\beta$. As a result, F(u,v) may be calculated on electronic processing devices with finite precision, with substantially less numerical instability, so that improved patterning of the target may be achieved using the corrected layout pattern.

In an embodiment convolution of the modified proximity effect function with the digital layout pattern is substantially invertible. By invertible is meant that the digital layout pattern can be substantially reconstructed from the result of the convolution of the modified proximity effect function with the digital layout pattern.

In an embodiment the alpha proximity effect function and the beta proximity effect function are sums—or linear combinations—of one or more Gaussian functions. For instance, the alpha proximity effect function may comprise or be defined as a Gaussian function $g\alpha(r)$ and the beta proximity effect function may comprise or be defined as a Gaussian function $g_\beta(r)$, wherein $\alpha$ represents the width of the direct exposure, i.e. the sum of forward scattering which causes the short range proximity effect and the electron beam spot size, $\beta$ represents the width of the backscattering which causes the long range proximity effect, with $\beta \gg \alpha$, r represents the distance between a position (x,y) on the resist to a point of incidence of a charged particle beam, and $\eta$ represents the ratio between exposure due to the long range and short range effect. A simple base proximity effect function h(r) was given above. For present day charged particle lithography systems, the parameter a typically has a value between 10 nm and 20 nm, $\beta$ typically has a value between 250 nm and 350 nm, and $\eta$ is typically between 0.4 and 0.6, e.g. 0.48.

An alternate example of a base proximity effect function $h_{alt}(r)$, which was proposed in "S. Aya, K. Kise, H. Yabe and K. Marumoto, Validity of double and triple Gaussian functions for proximity effect correction in X-ray mask writing", Japanese Journal of Applied Physics, 35, 1929-1936, 1996 is given as:

$$h_{alt}(r) = \frac{1}{1+\eta_1+\eta_2}\left[\frac{1}{\pi}g_\alpha(r) + \frac{\eta_1}{\pi}g_\beta(r) + \frac{\eta_2}{24\pi\gamma^2}\exp\left(-\sqrt{\frac{r}{\gamma}}\right)\right]$$

This slightly more complex base proximity effect function has been found to better model the proximity effect in some cases. A modified proximity effect function of $h_{alt}(r)$ may be determined based on said unmodified proximity effect function, e.g. by starting with the modified proximity effect function as a copy of the base proximity effect function and then replacing occurrences of the term $g_\alpha(r)$ with a Dirac delta $\delta(r)$ using substantially the same steps as described above.

In an embodiment, the Fourier transform of the beta proximity effect function approaches zero as the spatial resolution of the Fourier transform increases. However, as the Fourier transform of the Dirac delta function which replaces the alpha proximity effect function according to the method of the invention does not approach zero as the spatial resolution increases, deconvolution of the pattern by the modified proximity effect function according to F(u,v)=P(u,v)/H$_m$(k), will not lead to division by zero.

In a preferred embodiment the deconvolution is carried out in the Fourier domain, as convolution and deconvolution require fewer calculation in the Fourier domain, in particular when large amounts of data have to be processed. Typically, such deconvolution comprises the steps of Fourier transforming the modified proximity effect function, Fourier transforming the layout and then dividing the Fourier transformed layout pattern by the Fourier transformed modified proximity effect function.

In an embodiment the step of performing the deconvolution is carried out by calculating an approximation of said deconvolution, preferably using a Taylor expansion of the modified proximity effect function, e.g. as:

$$f(x,y) = p(x,y) \otimes (1+\eta) \cdot \begin{pmatrix} \delta(r) + \\ (-\eta)g_\beta(r) + \\ (-\eta)^2 g_\beta(r) \otimes g_\beta(r) + \\ (-\eta)^3 g_\beta(r) \otimes g_\beta(r) \otimes g_\beta(r) + \\ \ldots \end{pmatrix}$$

which can alternatively be denoted as:

$$f(x,y) = p(x,y) \otimes (1+\eta) \cdot \left( \delta(r) + \sum_{n=1}^{N} (-\eta)^n g_{\beta\sqrt{n}}(r) \right)$$

or as:

$$f(x,y) = (1+\eta) \cdot \left( p(x,y) + p(x,y) \otimes \sum_{n=1}^{N} (-\eta)^n g_{\beta\sqrt{n}}(r) \right)$$

wherein the latter notation clearly reflects that the corrected layout pattern function f(x,y) is a sum of the digital layout pattern function p(x,y) and a convolution of the digital layout pattern function p(x,y), scaled by a factor (1+η).

Preferably, the number of terms N of the Taylor expansion used for approximating f(x,y) is greater than or equal to 8. Applicant has found that when N equals at least this Taylor expansion in general has an error of less than 0.1%.

In an embodiment the method further comprises a step of normalizing said corrected layout pattern. This is may for instance be carried out by adding a positive constant to the corrected layout pattern such that it contains only positive dose values, and by multiplying the corrected layout pattern such that its maximum dosage value is equal to a predetermined maximum dosage value such as 100%.

In an embodiment said digital layout is modelled as a layout pattern function p(x,y), wherein said alpha proximity effect function and said beta proximity effect function are sums of one or more Gaussian functions g$_\alpha$(r) and g$_\beta$(r) respectively, wherein g$_\alpha$(r) and g$_\beta$(r) are Gaussian functions with β>>α, and wherein α and β can be substituted for σ in $$g_\sigma(r) = \frac{1}{\pi\sigma^2} e^{\frac{-r^2}{\sigma^2}};$$

wherein r is the distance of a charged particle beam when incident on the resist to point (x,y); said method comprising a step of calculating a background dose map, herein sometimes denoted background map or background dose correction map, as:

$$b(x,y) = p(x,y) \otimes (1+\eta) \cdot s \sum_{n=1}^{N} \left( (-\eta)^n g_{\beta\sqrt{n}}(r) \right) + c,$$

with s being a scaling constant, c being a constant offset; wherein producing said corrected layout pattern comprises calculating:

$$f_{n,c}(x,y) = p(x,y) \cdot (1+\eta) \cdot s + b(x,y)$$

The corrected layout pattern is preferably calculated as f$_{n,c}$(x,y). From the equation for f$_{n,c}$(x,y) it can be seen that calculating the corrected layout pattern comprises: a) scaling the original pattern, and b) adding the background map to the scaled pattern. Preferably, the corrected layout pattern is calculated using only a single convolution. The background dose map is essentially a scaled and offset Taylor expansion representation of the result of deconvolution of the digital layout pattern with the modified proximity function.

Though in an embodiment the digital layout function preferably comprises only binary values for individually switching said one or more charged particle beams either "on" to provide a maximum dosage value of energy to the resist or "off" to provide no energy to the resist, in another embodiment the digital layout function also provides gray-scale values, i.e. intermediate values between "on" and "off", for individually switching said one or more charged particle beams to provide amounts of energy to the resist between no energy and a maximum dosage value of energy, e.g. to provide 50% of the maximum dosage value of energy to the resist.

In an embodiment said step of normalizing said corrected layout pattern comprises: determining a densest pattern of a specific feature that may occur in the digital layout pattern; determining an energy dose required for patterning a target with said specific features in a pattern corresponding to said densest pattern; adding a constant offset to said corrected layout pattern to produce an offset corrected layout pattern in which all values are greater than or equal to zero; and scaling said offset corrected layout pattern so that features within said pattern which are arranged in a densest pattern have dosage of 100% and, features outside of said densest pattern have a higher dosage. For example, a densest pattern of specific features may comprise a pattern of line shaped features or contact shaped features which are distributed at a pitch relative to each other which is the smallest pitch between such line shape or contact shaped features that may occur in the digital layout pattern.

In an embodiment, said method comprises a step of, prior to calculating said corrected layout function based on said deconvolution of the digital layout pattern with said modified proximity effect function, using an electronic processor to perform a short range proximity correction on said digital layout pattern. Thus the digital layout pattern is modified to at least partially correct for an alpha proximity effect, prior to calculating the corrected layout pattern, e.g. prior to calculating a background dose map. The short range proximity correction may be carried by local adjustment of dose and/or feature boundaries of the digital layout function, in an iterative scheme. The short range proximity correction uses only the alpha proximity effect function of the base proximity function and is independent of the beta proximity effect function. Together when carried in order short range correction first and long range correction next, the short range and long range corrections enable proximity correction for the entire base proximity function.

When a pattern with maximum reference density $d_{REF}$ of specific features, such as lines or contacts that may occur in the digital layout is known, and a corresponding dose reference $D_{REF}$ which is required for transferring such a pattern to a resist is known as well, then a reference dose $D_{REF\alpha}$ for the short range proximity effect correction can be approximated as $$D_{REF\alpha} = \frac{D_{REF}}{1 + \eta \cdot \left(1 - \left(\frac{1}{l}\right) \cdot D_{REF} \cdot d_{REF}\right)}$$

wherein l is a threshold energy below which the resist is not developed. A typical value for l is 0.5. The reference dose $D_{REF}$ is the dose required for patterning a specific feature, such as a line or a contact, in an area of the target wherein a pattern of features is distributed in the densest allowable manner, while still remaining separate from each other.

The short range proximity correction may be carried out by scaling the digital layout function p(x,y) such that the maximum dose is equal to $D_{REF\alpha}$, then iteratively modifying p(x, y) to adjust the geometries (i.e. the widths) of the features so that the short range proximity effect is at least partially compensated for, and then scaling the layout function p(x,y) such that the maximum dose for all features is substantially equal to $D_{REF}$. Based on the resulting layout function p(x,y) the corrected layout function may then be calculated according to the method of the present invention.

In an embodiment said step of performing a deconvolution results in calculation of a background dose correction map which is based on a dose density distribution in the corrected layout pattern, wherein said corrected layout pattern is produced as a linear combination of said background dose correction map and said digital layout pattern.

In an embodiment said deconvolution of the layout pattern with the modified proximity function corrects for the beta proximity effect function without correcting for the alpha proximity effect function. The deconvolution of the layout pattern with the modified proximity function provides a proximity correction for only the beta proximity effect function of the base proximity effect function, and may in principle be formulated analytically, i.e. there exists a deconvolution of the layout pattern with the modified proximity function. Because such a deconvolution exists the beta proximity effect correction may be calculated by performing said deconvolution only once. The deconvolution may be calculated using numerical methods, including for example the (Fast) Fourier Transform.

In an embodiment the background dose map is calculated in a single non-iterative step during calculation of the corrected layout pattern. Conventional methods for correcting for the beta proximity effect typically comprise a step of determining a theoretical exposure result as a convolution of the digital layout pattern with the beta or base proximity function and a step of adapting geometries of individual features in the digital layout pattern based on said exposure results, wherein these steps are repeated multiple times or until the exposure result approximates the original digital layout pattern to a sufficient extent. According to the present invention the corrected layout pattern may be calculated substantially faster as the corrected layout pattern can be calculated in a single iteration, i.e. can be calculated by evaluating the digital layout pattern only once In an embodiment said corrected layout pattern comprises corrected features corresponding to features in the digital layout pattern, wherein each corrected feature has boundaries substantially corresponding to boundaries of the corresponding feature in the digital layout pattern, and wherein the dose for said feature in the corrected pattern layout differs from the dose for the corresponding feature in the digital layout pattern by an amount based on said background dose map.

In an embodiment the method comprises a step of patterning said target using said corrected layout pattern.

According to a second aspect, the present invention provides a method for performing a charged particle beam proximity effect correction process, said method comprising the steps of: receiving a digital layout of a pattern to be patterned onto a target using one or more charged particle beams; selecting a base proximity effect function comprising a sum of an alpha proximity effect function and a beta proximity effect function, wherein said alpha proximity effect function models a short range proximity effect and said beta proximity effect function models a long range proximity effect, wherein a constant $\eta$ is defined as a ratio between the beta proximity effect function and the alpha proximity effect function in said sum, with $0<\eta<1$, wherein said digital layout is modelled as a layout pattern function p(x,y), wherein said alpha proximity effect function and said beta proximity effect function are sums of one or more Gaussian functions $g_\alpha(r)$ and $g_\beta(r)$ respectively, wherein $g_\alpha(r)$ and $g_\beta(r)$ are Gaussian functions with $\beta \gg \alpha$, and wherein $\alpha$ and $\beta$ can be substituted for $\sigma$ in $$g_\sigma(r) = \frac{1}{\pi\sigma^2} e^{\frac{-r^2}{\sigma^2}},$$

wherein r is the distance of a charged particle beam when incident on the resist to point (x,y), said method comprising a step of calculating a background dose map as:

$$b(x, y) = p(x, y) \otimes (1 + \eta) \cdot s \sum_{n=1}^{N} \left((-\eta)^n g_{\beta\sqrt{n}}(r)\right) + c$$

with s being a scaling constant, c being a constant offset, and further comprising a step of producing a corrected layout which step comprises calculating:

$$f_{n,c}(x,y) = p(x,y) \cdot (1+\eta) \cdot s + b(x,y)$$

Said corrected layout pattern is preferably calculated as $f_{n,c}(x,y)$. The values for b(x,y) and $f_{n,c}(x,y)$ may be calculated numerically using an electronic processor, substantially without leading to numerical instabilities during calculation. The value for N is preferably at least equal to 8. It will be appreciated that s is a scaling constant greater than zero.

In an embodiment the value of said constant s is substantially equal to $1/(1+\eta)$.

In an embodiment said constant c is dependent on a densest distribution of line shaped features that that may occur in said digital layout pattern and wherein the value of c is within the range $0.45 \cdot \eta/(1+\eta)$ to $0.55 \cdot \eta/(1+\eta)$, preferably substantially equal to $0.5 \cdot \eta/(1+\eta)$.

In an embodiment said constant c is dependent on a densest distribution of contact shaped features that may occur in said digital layout pattern wherein the value of c is within the range $0.30 \cdot \eta/(1+\eta)$ to $0.60 \cdot \eta/(1+\eta)$, preferably substantially equal to $0.45 \cdot \eta/(1+\eta)$.

According to a third aspect, the present invention provides a method for performing a charged particle beam proximity effect correction process, said method comprising the steps of: receiving a digital layout of a pattern to be patterned onto a target using one or more charged particle beams; selecting a base proximity function comprising a sum of an alpha proximity function and a beta proximity function, wherein said alpha proximity function models a short range proximity effect and said beta proximity function models a long range proximity effect, wherein a constant r is defined as a ratio between the beta proximity function and the alpha proximity function in said sum, said method comprising the steps of: determining a modified proximity function corresponding to said base proximity function, wherein in said modified proximity function the alpha proximity function is replaced by a function which is invertible in the Fourier domain and has a frequency response over substantially the entire frequency range of the digital layout pattern, and producing a corrected layout pattern based on a deconvolution of the digital layout pattern with the modified proximity function. The operation of exposure of the digital layout pattern may be mathematically described by convolution of said layout with the base proximity function. In the common case where the base proximity function consists of the sum of two or more Gaussians, the operation of exposure cannot be mathematically inverted (deconvoluted), because the Fourier transform of the (multi-Gaussian) base proximity function does not have a reciprocal. Preferably, the corrected layout pattern is produced, e.g. calculated using an electronic processor.

The modified proximity effect function in which the alpha proximity effect function is replaced essentially provides an approximation that enables mathematical deconvolution of the exposure operation, as the reciprocal of the Fourier transform of said modified function exists. The function which is invertible in the Fourier domain and has a frequency response over substantially the entire frequency range of the digital layout pattern is preferably the Dirac delta function.

According to a fourth aspect, the present invention provides a charged particle lithography system comprising an electronic processor adapted for performing the method according to the present invention and/or for producing a corrected layout pattern from a data structure according to the present invention In an embodiment, said charged particle lithography system comprises a charged particle beam source for emitting a charged particle beam, an aperture array for splitting said beam into a multitude of charged particle beams, a beam blanker array adapted for individually blanking beams of said multitude of charged particle beams, for allowing said beams to completely or partially reach to target or not, and a controller, adapted for controlling said blanker array for blanking said beams, based on the corrected layout pattern produced by said electronic calculator.

According to a fifth aspect, the present invention provides a data structure comprising a representation of a corrected layout pattern produced using a method according to the present invention. The data structure preferably represents each feature of the digital layout pattern as a number of polygons, e.g. rectangles, wherein for each polygon an associated dose value is encoded in the layout pattern. The corrected layout pattern preferably comprises a number of polygons and associated dose values. The number of polygons required for representing the digital layout pattern is typically less than the number of polygons required for representing the corrected layout pattern, as the features in the corrected pattern typically require a higher resolution than the features in the digital layout pattern. The data structure, which is typically is typically stored in a computer file, may be transferred to or provided on a medium, and/or may for instance be transferred via a network connection such as the Internet.

In an embodiment said corrected layout pattern is stored in a vector based format, such as OASIS or GDS. The corrected layout is preferably represented as discrete polygons (e.g. rectangles) encoded by the corners and associated dose values.

In an embodiment said representation comprises a representation of the digital layout pattern and a separate representation of the background dose map. As described earlier, the corrected layout pattern comprises a term representative of the scaled digital layout pattern and a term representing a more slowly varying background dose map. That the background dose map typically varies more slowly than the digital layout pattern can be seen from the fact that the Gaussians $g_{\beta\sqrt{n}}$ are typically hundreds of nm wide, which may be represented by much larger polygons in the data structure. The polygons of the digital layout pattern may overlap the polygons of the background dose map and/or may be superimposed thereon to form the corrected layout pattern.

Usually, the representations of the digital layout pattern and of the background dose map are combined during patterning of a target to output the corrected layout pattern on the target. Performing a beta proximity effect correction by adding the background dose map to a scaled version of the digital layout pattern is particularly advantageous for a raster scan lithography system. In other kinds of lithography systems, such as shaped beam lithography systems, the throughput, i.e. number of targets such as wafers that can be patterned per unit time, scales with the number of polygons in the digital layout pattern, which number of polygons is increased after background addition as the background dose map spans across the entire digital layout pattern and is added to the digital layout pattern.

In contrast, in raster scan systems substantially the entire area of the target is scanned by one or more charged particle beams of the system, so that the throughput is substantially less dependent on the number of polygons in the digital layout pattern. Having to write the background map dose map onto the target in addition to the digital layout pattern thus does not substantially reduce the throughput.

In an embodiment said representation of the digital layout pattern comprises a number of polygons and associated dose values, and wherein said representation of the background dose map comprises a number of polygons and associated dose values to be superimposed on the digital layout pattern to form said corrected layout pattern.

In an embodiment a radius in which the dose of the background dose map varies is proportional to a radius of influence the beta proximity function, said radius preferably substantially corresponding to p. Thus the value of the magnitude of the radius in which the background dose map varies is closer to the magnitude of the radius of influence of the beta proximity function than to the magnitude of the radius of influence of the alpha proximity effect function, e.g. closer to β than to α. This allows the background dose map to be represented using relative large polygons (for example rectangles on a regular grid) of the background with sizes of the same order as said radius. The dimensions of the individual features are typically much smaller than said radius. Because the background dose map can thus be represented using relatively large and few polygons the data volume of the data structure can remain relative small. The magnitude of the radius in which the background dose map varies may be equal to or substantially equal to β.

In an embodiment said background dose map is represented as a number of adjacent and non-overlapping polygons each having a size which is substantially larger than a smallest feature size in the digital layout pattern. A ratio of the average radius of the polygons to an average radius of the features in the digital layout pattern is preferably substantially equal to a ratio of the β-parameter for $G_\beta(x,y)$ to the α-parameter of $G_\alpha(x,y)$ in the base proximity effect function.

In an embodiment said background dose map is represented as a number of adjacent and non-overlapping polygons having a size which is substantially larger than a smallest feature size in the digital layout pattern.

In an embodiment, the data structure is embodied on a computer readable medium, such as a magnetic disc, optical disc, volatile memory, or non-volatile memory. The data structure on the computer readable medium may be input to by a charged particle lithography system comprising a charged particle beam source for emitting a charged particle beam, an aperture array for splitting said beam into a multitude of charged particle beams, a beam blanker array adapted for individually blanking beams of said multitude of charged particle beams, for allowing said beams to completely or partially reach to target or not, and a controller, adapted for controlling said blanker array for blanking said beams, based on the corrected layout pattern produced stored in said data structure on said computer readable medium.

According to a sixth aspect, the present invention provides a digital signal comprising a corrected layout pattern produced using the method of the present invention.

According to a seventh aspect, the present invention provides a computer readable medium, comprising instructions thereon for causing a computer to perform the method according to the present invention. The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 4A shows a graph of the digital layout of FIG. 3A when deconvoluted with a modified proximity effect function according to the present invention, FIG. 4B shows a graph of the theoretical dose that would be deposited in a target when one or more charged particle beams are modulated based on the corrected layout shown in FIG. 4A, FIG. 5A shows a graph of a background dose map, as calculated according to the present invention, FIG. 5B shows an approximation of the background dose map of FIG. 5A.

DETAILED DESCRIPTION OF THE INVENTION

Figure 1A:
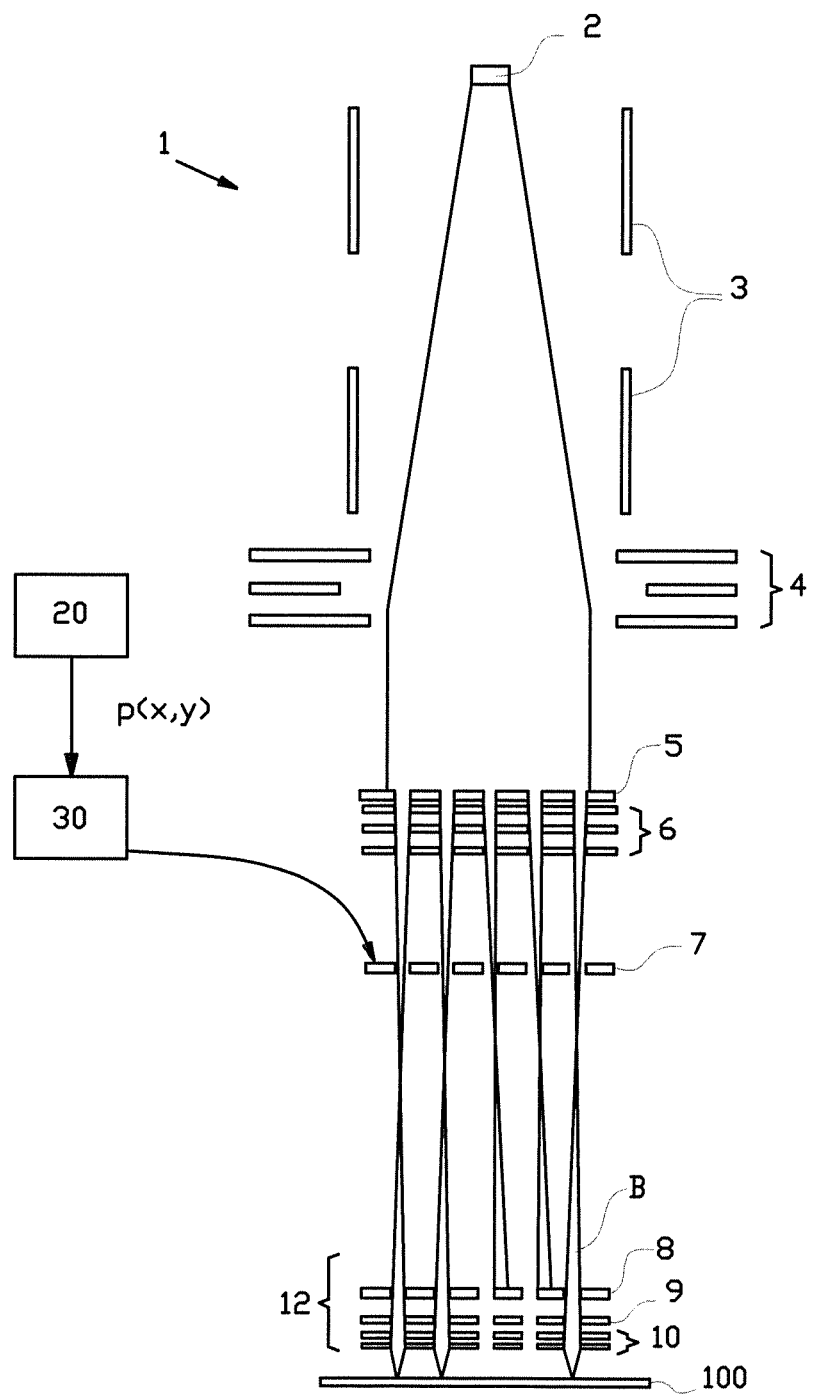
FIG. 1A shows a schematic diagram of a charged particle lithography system according to the present invention.

FIG. 1A schematically shows a multi-beamlet charged particle lithography system 1 according to the present invention. The system comprises a charged particle beam source 2 which emits a charged particle beam which traverses a double octopole 3 and collimator lens 4 before impinging on an aperture array 5. The aperture array then splits the beam into a multitude of charged particle beams which are condensed by condenser array 6. At beam blanker array 7 individual beams may be blanked, i.e. may be deflected such that they encounter beam stop array 8 later on in their trajectories instead of passing through apertures in beam stop array 8. An electronic processor 30 is arranged for receiving, from a digital storage 20, a digital layout p(x,y) of a pattern to be transferred to the target, and for calculating a corrected layout pattern which compensates at least partially for the proximity effect as described in more detail below. The electronic processor comprises a controller which is adapted for streaming the corrected layout pattern to the beam blanker so that the beam blanker may modulate, e.g. blank, partially blank or not blank, each beam of the multitude of beams individually, based on the corrected layout pattern.

The beams that have not been blanked pass through a deflector unit 9 which is adapted to provide a scanning deflection of said beams in X- and Y-directions substantially normal to the path the beams are travelling in. The deflector unit typically comprises a conductive material which extends over its outer surface. At the end of their trajectories the beams that have not been blanked pass through a lens array 10 adapted for focusing said beams onto a surface of a target 11 which is covered with a resist. The beam stop array 8, deflector unit 9 and lens array 10 together comprise projection lens assembly 12 which provides blocking of blanked beams, scanning deflection of the multitude of beams, and demagnification of unblanked beams.

Figure 1B:
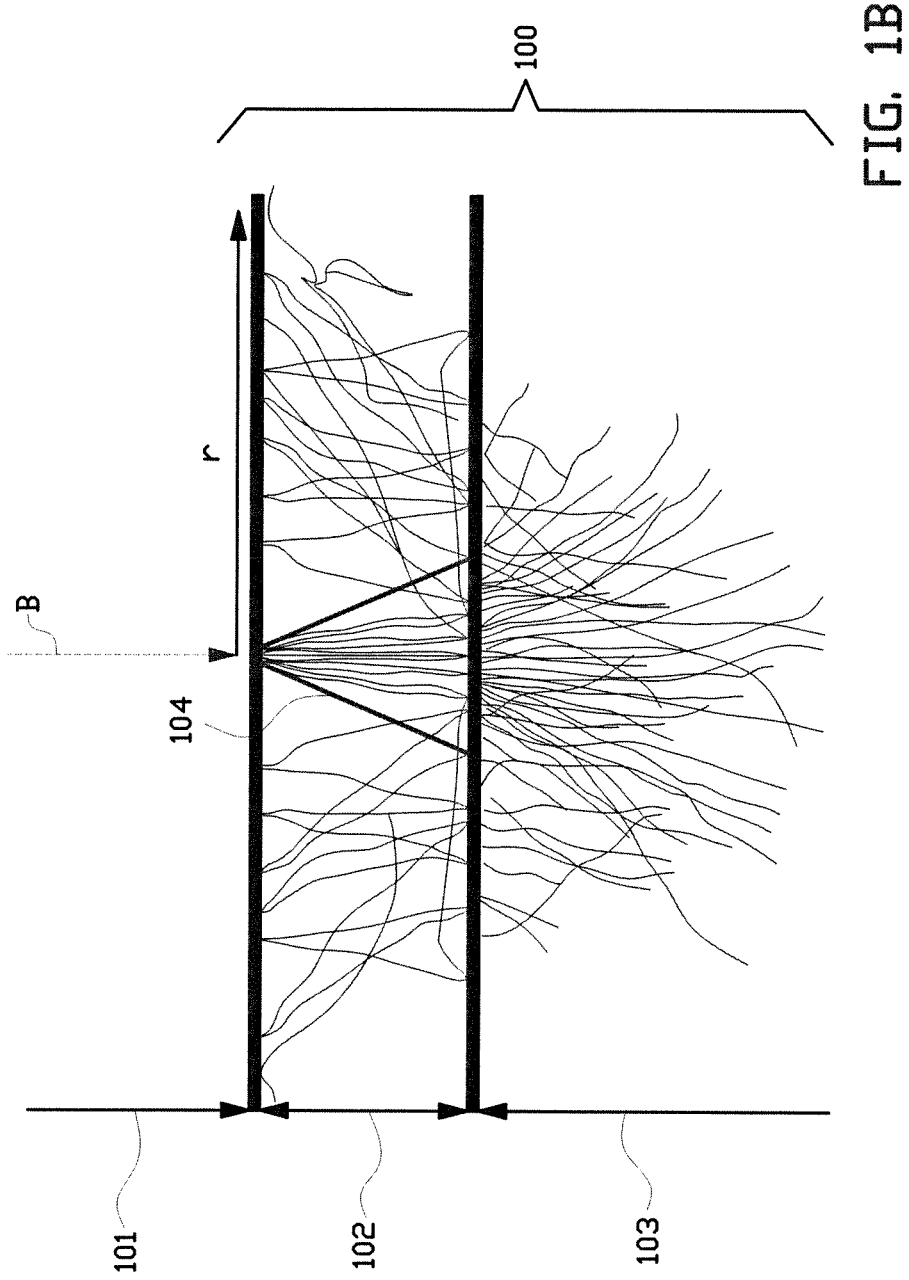
FIG. 1B illustrates the proximity effect which typically occurs when patterning a target using such an charged particle lithography system.

FIG. 1B illustrates the proximity effect as commonly known. A charged particle beam B, e.g. an electron beam, travelling through a vacuum 101 impinges on a target 100 comprising a layer of resist 102 which covers a substrate layer 103 such as a silicon or silicon oxide layer. As the charged particle beam B travels through the layer of resist 102, the charged particles thereof are somewhat scattered due to forward scattering, such that a portion of the energy of the charged particles is deposited in a substantially cone-shaped volume 104 in the resist. Backscattering of the charged particles occurs when they impinge on a nucleus of an atom in the resist or in the substrate and an elastic collision occurs. As a result of the backscattering, the charged particles deposit their energy over an even greater volume than the cone.

Figure 2:
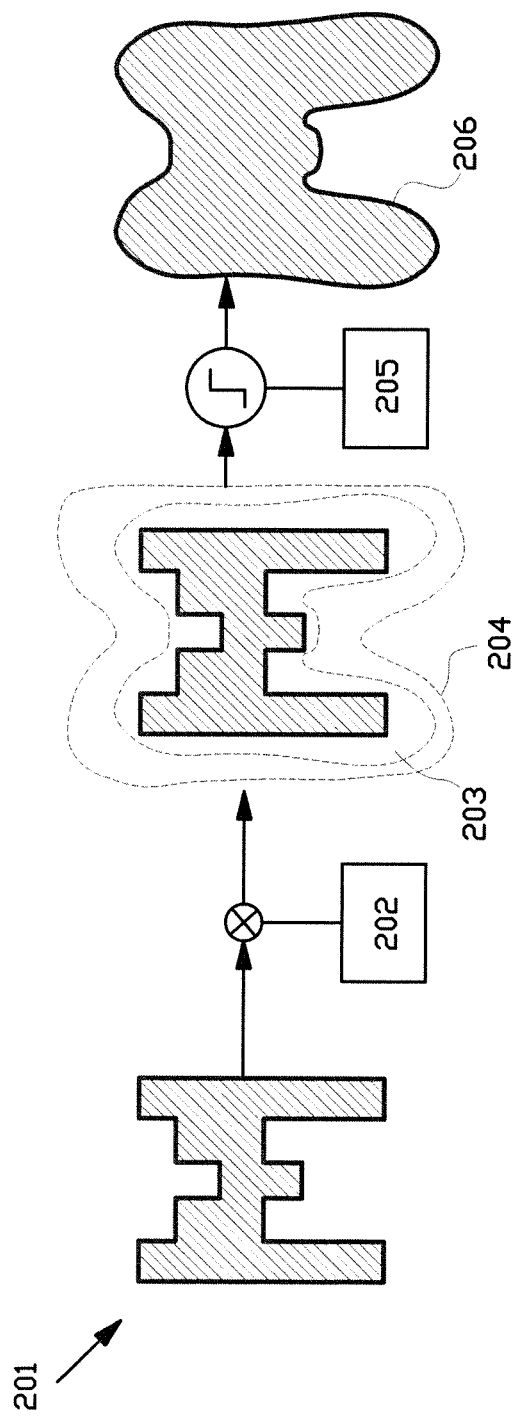
FIG. 2 shows a further illustration of the proximity effect.

FIG. 2 schematically shows how the proximity effect leads to a loss in resolution of features patterned on a target when compared to the resolution of a received digital layout patter 201. The layout pattern 201 shows a two-dimensional image to be transferred a target. Shaded portions of the layout 201 indicate that at those positions a dose of energy should be deposited to the resist sufficient to develop that position, whereas no dose, or a significantly lower does, should be deposited at positions in the non-shaded area so that the non-shaded area remains undeveloped. In the layout 201 each shaded portion should get substantially the same dose, e.g. the energy deposited per unit area should be substantially the same for each shaded portion.

Though the features in layout pattern 201 are sharply defined, i.e. not blurred, the distribution of energy that is deposited in the resist is less well defined, due to the proximity effect, here modelled by a convolution 202 of the layout 201 and a proximity effect function 203.

This convolution results in a convoluted image of the layout, which is typically a blurred image of the layout. The difference in energy deposited in an area to be developed and an area to remain undeveloped is not as sharply defined as in the layout 201. Rather the amount of deposited energy transitions more gradually and smoothly, e.g. along contour lines 203,204. For instance, when the dose deposited along contour line 203 is 90% then the dose deposited within the contour 203 is 90% or more. The dose deposited along contour line 204 may be 40%, and the dose on points between contour line 203 and 204 will vary gradually from 90% to 40%. When the resist is developed, here indicated by threshold symbol 205, only those portions of resist which received at least a threshold energy amount are developed, and the remaining portions remain undeveloped. It can be seen that due to the proximity effect, which is here modelled as a convolution with a proximity function, the resulting pattern 206 differs significantly from the received digital layout pattern 201. Convolution of the layout pattern with the proximity function is generally not invertible, i.e. it is generally not possible to completely reconstruct the layout pattern 201 from the blurred image, even when the proximity effect function is known, as high frequency information is not presented in the blurred image and can thus not be derived therefrom.

Figure 3A:
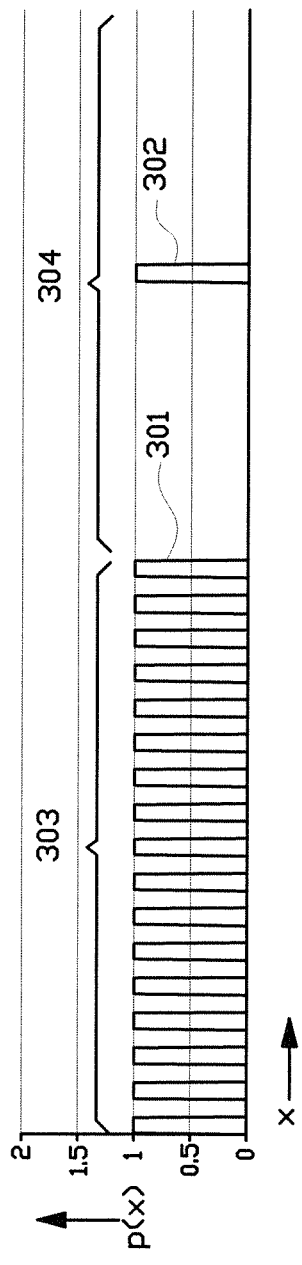
FIG. 3A shows a 1-dimensional example of a digital layout to be transferred onto a target.

FIG. 3A shows an example in one dimension of a pattern $p(x)$ to be transferred to a resist. Based on the value of $p(x)$, each position x on the resist is either illuminated with a single dose, i.e. 100% of the energy required to develop a position on the resist or not illuminated at all when no energy should be deposited at position x of the resist, i.e. position x should receive a dose of 0%. The pattern comprises a portion 303 with a dense distribution of features 301, e.g. spaced apart from each other no more than the width of a feature, and a portion 304 with a sparse distribution of features, in the case shown containing only a single feature 302 to be patterned. The features in the dense portion 303 and the feature in the sparse portion 304 all have the same dimensions. If one or more charged particle beams which scan the resist along the direction x are switched on or off based on the pattern function $p(x)$, then due to the proximity effect the resulting energy deposited in the target will a be blurred version of $p(x)$.

Figure 3B:
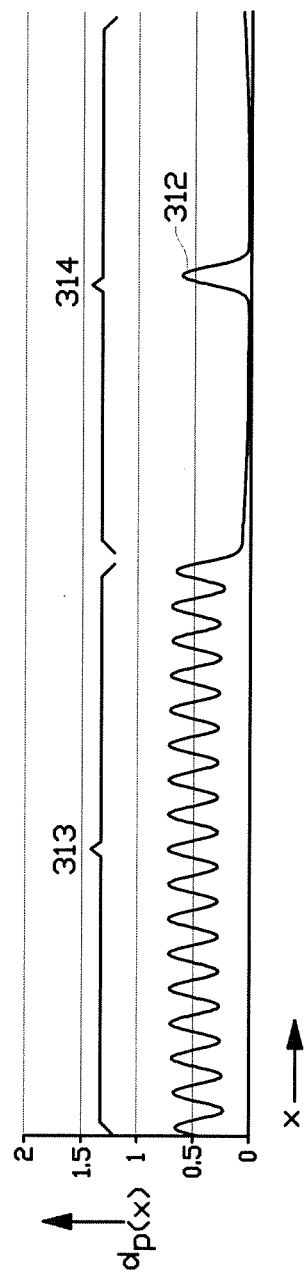
FIG. 3B shows a graph of the resulting dose deposited in a resist of the target when one or more charged particle beams are modulated based on the digital layout of FIG. 3A.

FIG. 3B illustrates a graph of the energy deposited $d(x)$ in a resist if one or more charged particle beams are controlled to expose the resist based on the pattern $p(x)$ of FIG. 3A. The deposited dose graph comprises a portion 313 in which peaks are relatively densely distributed and a portion 314 in which the distribution of peaks is sparse, in this case showing only one peak. The peaks in the dense portion 313 are highest around the middle of the dense portion and are lower toward the sides of the dense portion. Peak 312 in the sparse portion 314 is the lowest peak in the graph, because this peak is not proximate to any other peaks which contribute to the energy deposited at the position of peak 312.

After the resist has been exposed, it is typically developed at a specific cut-off energy, or development threshold, so that portions of the resist in which less energy was deposited than the development-threshold remain substantially undeveloped, and portions of the resist in which the deposited energy is at least equal to the development-threshold are developed. For instance, if in the graph of FIG. 3B the resist were developed with a development threshold of 0.5, then the developed pattern will comprise those sections of the line $d_p(x)=0.5$ which lie under a peak. However, due to the proximity effect, not all of these sections have a same width, even though the features to be patterned do, as shown in FIG. 3A.

To at least partially compensate for the proximity effect, the dosage function $p(x)$ is deconvoluted with a modified proximity effect function, to produce a deconvoluted dosage function $f(x)$ shown in FIG. 4B. The modified proximity effect function corresponds to a base proximity effect function in which the alpha proximity function which models the short range proximity effect has been replaced by the Dirac delta, as described above. The deconvolution causes the value of $f(x)$ to be more than 1 (i.e. more than 100% of the dose required to be deposited in the resist for a feature) in some cases, and less than 0, i.e. negative in other cases.

The theoretical result of exposing a resist with one or more charged particle beams based on the deconvoluted dosage function $f(x)$ is shown in FIG. 4B, which shows a theoretical deposited dose $d_f(x)$. Again assuming a development threshold of 0.5, it can be seen that the widths of the sections of the line $f(x)=0.5$ under the peaks are substantially more equal to each other than the widths of the sections of line $d(x)=0.5$ under the peaks in FIG. 3B. When the resist is developed, the resulting pattern on the target thus more closely corresponds to $p(x)$ than if exposure of the resist by the one or more particle beams were controlled based on $p(x)$ itself.

Figure 5C:
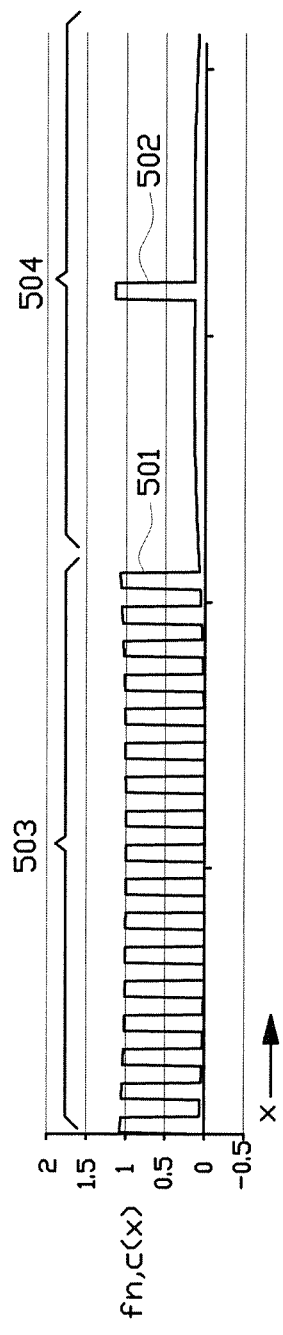
FIG. 5C shows a graph of a corrected dosage function as calculated for the digital layout of FIG. 3A, to the present invention.

However, as it is generally not possible to apply a negative dose, the deconvoluted dosage function $f(x)$ typically not used directly for modulating one or more charged particle beams to deposit energy on the resist or not. Instead a so called background dose correction function, or background map $b(x)$, for correcting for the long range proximity effect, is calculated. The background map $b(x)$ is a smooth function based on the density distribution of features in the pattern to be written on the target. When the density of features is relatively high, the background dose map will have a relatively low value and vice versa, to compensate at least partially for the long range proximity effect. The background dose correction function may be expressed as:

$$b(x) = p(x) \otimes (1+\eta) \cdot s \sum_{n=1}^{N} \left((-\eta)^n g_{\beta\sqrt{n}}(r)\right) + c$$

with s being a scaling constant, c being a constant offset, and r being the distance of a charged particle beam when incident on the resist to position x. A graph of the background map calculated for $p(x)$ is shown in FIG. 5A. To more clearly show the values of b(x), the graphs in FIGS. 5A and 5B are shown at a different scale than the graphs of FIGS. 5C and 5D.

The background dose map b(x) depends on how densely features are distributed around a position where the charged particle beam is incident, i.e. on how much the long range proximity effect contributes to energy being deposited at position x when a charged particle beam is incident on the resist at a position spaced apart therefrom. It can be seen that portion 523 of b(x), which corresponds to the densely patterned portion 303 of p(x) shown in FIG. 3A, has relatively low values, indicating that no or only small compensation has to be made for the long range proximity effect along this portion. Along portion 524, corresponding to the sparsely patterned portion 304 of p(x) as shown in FIG. 3A, the value of b(x) is substantially higher, indicating that the dosage for peak 302 should be corrected to a greater extend.

Once the background map has been calculated, a normalized and background corrected dosage function $f_{n,c}(x)$ is determined as follows:

$$f_{n,c}(x) = p(x) \cdot (1+\eta) \cdot s + b(x)$$

If the layout pattern is given as a two dimensional pattern p(x,y), the corresponding normalized background map b(x,y) may be calculated as:

$$b(x,y) = p(x,y) \otimes (1+\eta) \cdot s \sum_{n=1}^{N} \left( (-\eta)^n g_{\beta\sqrt{n}}(r) \right) + c$$

with r being the distance of a charged particle beam when incident on the resist to position (x,y), and the normalized and corrected dosage function $f_{n,c}(x,y)$ can be calculated as:

$$f_{n,c}(x,y) = p(x,y) \cdot (1+\eta) \cdot s + p(x,y)$$

In both the 1-dimensional case and the 2-dimensional case, the normalized and corrected dosage function is completely positively valued, and the dosage for features which lie in a portion in which the feature distribution is dense does not exceed 100%, and preferably is substantially equal to 100%.

FIG. 5B shows an approximation of the background dose map by a plurality of adjacent and non-overlapping polygons, in this case rectangles, 531-538. The polygons are substantially larger than the features in the digital pattern layout, so that considerably fewer such polygons may be used to approximate the background dose map than the number of polygons required to define the digital background pattern. The features in the digital layout pattern are preferably represented by polygons, e.g. rectangular polygons, which define the boundaries of the features in the pattern.

Polygons 531-538 in FIG. 5B are arranged equidistantly and each have substantially equal spatial dimensions. The height of each polygon defines a dose for said polygon and is based on the value of b(x). In the example shown the height of each rectangle is substantially equal to the value of b(x) at the middle of the rectangle. The corrected layout pattern may be calculated by adding the approximation of the background map to the digital layout pattern and normalizing the result.

FIG. 5C shows a graph of $f_{n,c}(x)$. It can be seen that the dosage for features in the middle portion of dense portion 503 is substantially equal to the dosage for said middle portion in the digital layout pattern p(x) shown in FIG. 3A, i.e. substantially equal to 100%. For features on either side of the middle portion of dense portion 503, and for feature 502, the dosage function $f_{n,c}(x)$ has values slightly higher than 100%, to compensate for the long range proximity effect.

Though the scaling constant s and offset constant c may be determined empirically, when a densest reference pattern and a corresponding reference dose are known, the constants s and c are preferably determined by calculating these values based on the densest reference pattern and the corresponding reference dose. The densest reference pattern that the digital layout may contain depends on the features that are to be patterned on the resist. For instance, when the resist is to be patterned with relatively small square or disc shaped features, such as contacts, the reference pattern should provide a pattern with a densest distribution of such square or disc shaped features that may occur in a pattern. When the resist is to be patterned with lines, the reference pattern should contain a densest distribution of such lines.

The reference dose required for patterning a feature in such a densest reference pattern should be set to a value of 1, i.e. a dose of 100%. Thus, if a feature in a pattern p(x) at position x is located in a portion with a densest feature distribution corresponding to the reference pattern, then s and c are chosen such that $f_{n,c}(x)$ is substantially equal to the reference dose i.e. substantially equal to 100%.

The value of s is preferably chosen to be substantially equal to $1/(1+\eta)$. When the densest reference pattern is formed by lines, the value of c is preferably within the range $0.45 \cdot \eta/(1+\eta)$ to $0.55 \cdot \eta/(1+\eta)$, preferably substantially equal to $0.5 \cdot \eta/(1+\eta)$. When the densest reference pattern is build up by contacts, the value of c is preferably within the range $0.30 \cdot \eta/(1+\eta)$ to $0.60 \cdot \eta/(1+\eta)$, preferably substantially equal to $0.45 \cdot \eta/(1+\eta)$.

Figure 5D:
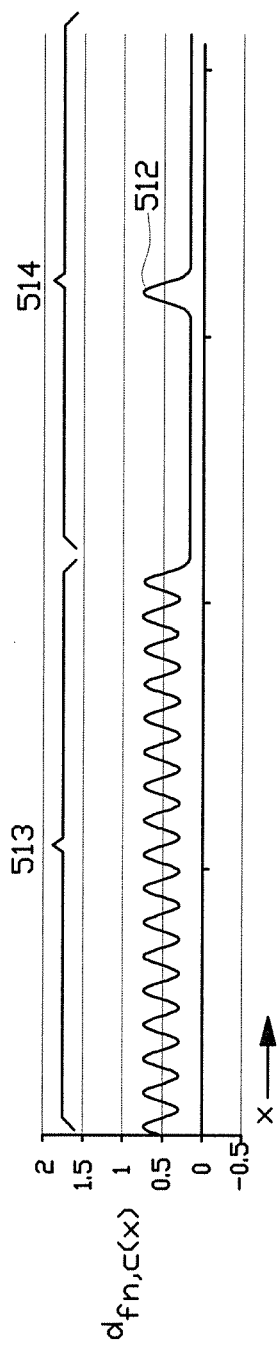
FIG. 5D shows a graph of the resulting energy deposited in a resist of target when the corrected dosage function of FIG. 5C is used for controlling one of more charged particle beams for illuminating the resist, FIGS. 6A and 6B each show a flow chart of a method according to the present invention, for calculating a corrected dosage function.

FIG. 5D shows a graph of the actual energy deposited in a resist when the resist is illuminated by one or more charged particle beams, based on the normalized corrected dosage function $f_{n,c}(x)$. As can be seen, the resulting energy depositions are substantially more uniform in width than the energy depositions shown in FIG. 3B, for a range of development thresholds, in particular for the development threshold at $d_{n,c}(x) = 0.5$.

Figure 6A:
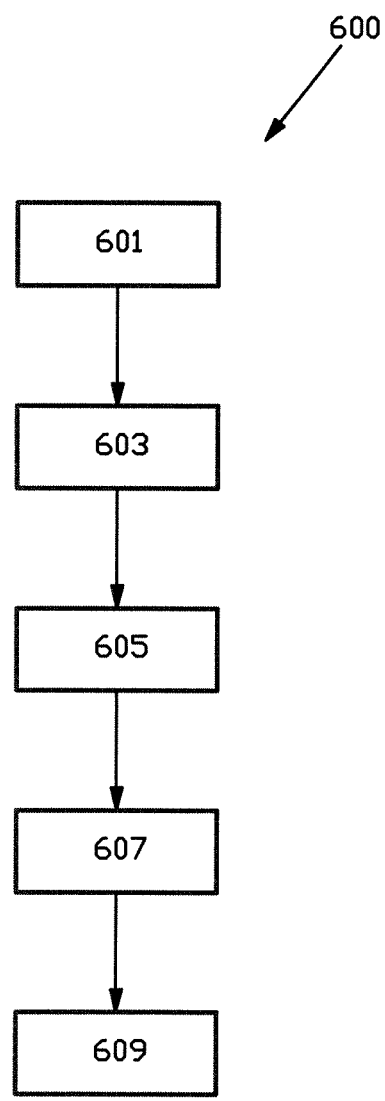

FIG. 6A shows a flow chart of steps of a method according to the present invention, to be performed by an electronic processor, preferably by an electronic processor which is part of a charged particle beam lithography system. In step 601 the processor receives a digital layout of a pattern to be patterned onto a target using one or more charged particle beams. In step 603 the processor selects, or is provided with, a base proximity function, or point spread function, comprising a sum of an alpha proximity function and a beta proximity function. Typically the base proximity function is selected or provided in correspondence with factors such as the materials of the target and the resist used, resist thickness, the primary beam energies of the one or more charged particle beams and/or the development process used for developing the resist.

In step 605 the electronic processor determines a modified proximity function as the base proximity function in which said alpha proximity function is replaced by a Dirac delta function.

Step 607 comprises the electronic processor calculating a corrected layout pattern by performing a deconvolution of the digital layout pattern with the modified proximity function. As the modified proximity function contains the Dirac delta function instead of the alpha proximity function, numerical instability during said calculation is substantially reduced or avoided altogether. Step 609 may also comprise suitable scaling of the corrected layout pattern as described above, e.g. such that features in a dense portion of the corrected layout pattern are illuminated with a dose substantially equal to a dose of 100%.

Figure 6B:
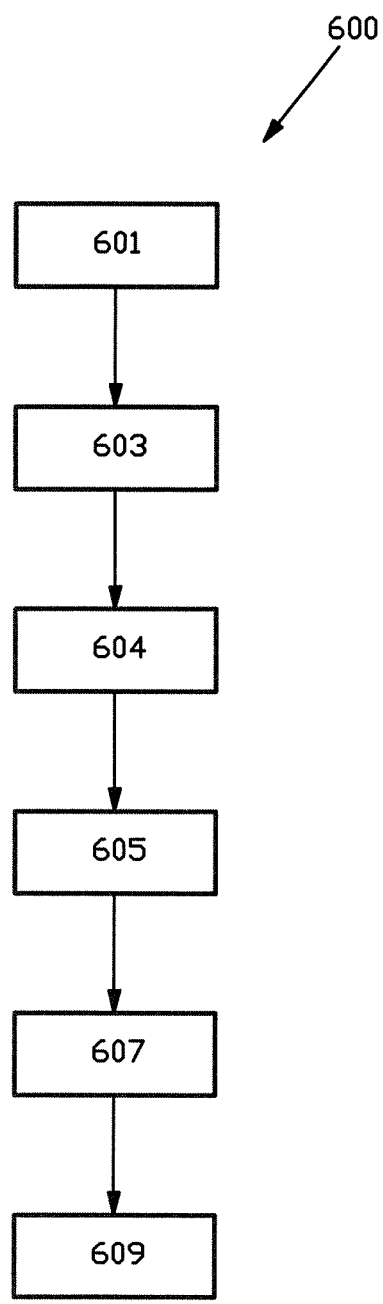

FIG. 6B shows a flowchart of an alternative method according to the invention, in which steps 601,603,605,607,609 are the same as in FIG. 6A, but in which prior to step 605 a step 604 is performed in which the electronic processor carries out a short range proximity correction on said digital layout pattern. Though in the embodiment shown step 604 is performed just prior to determining the modified proximity function, it will be appreciated that step 604 may be performed at any time as long as said step 604 is performed prior to calculation of the corrected layout pattern.

Figure 7:
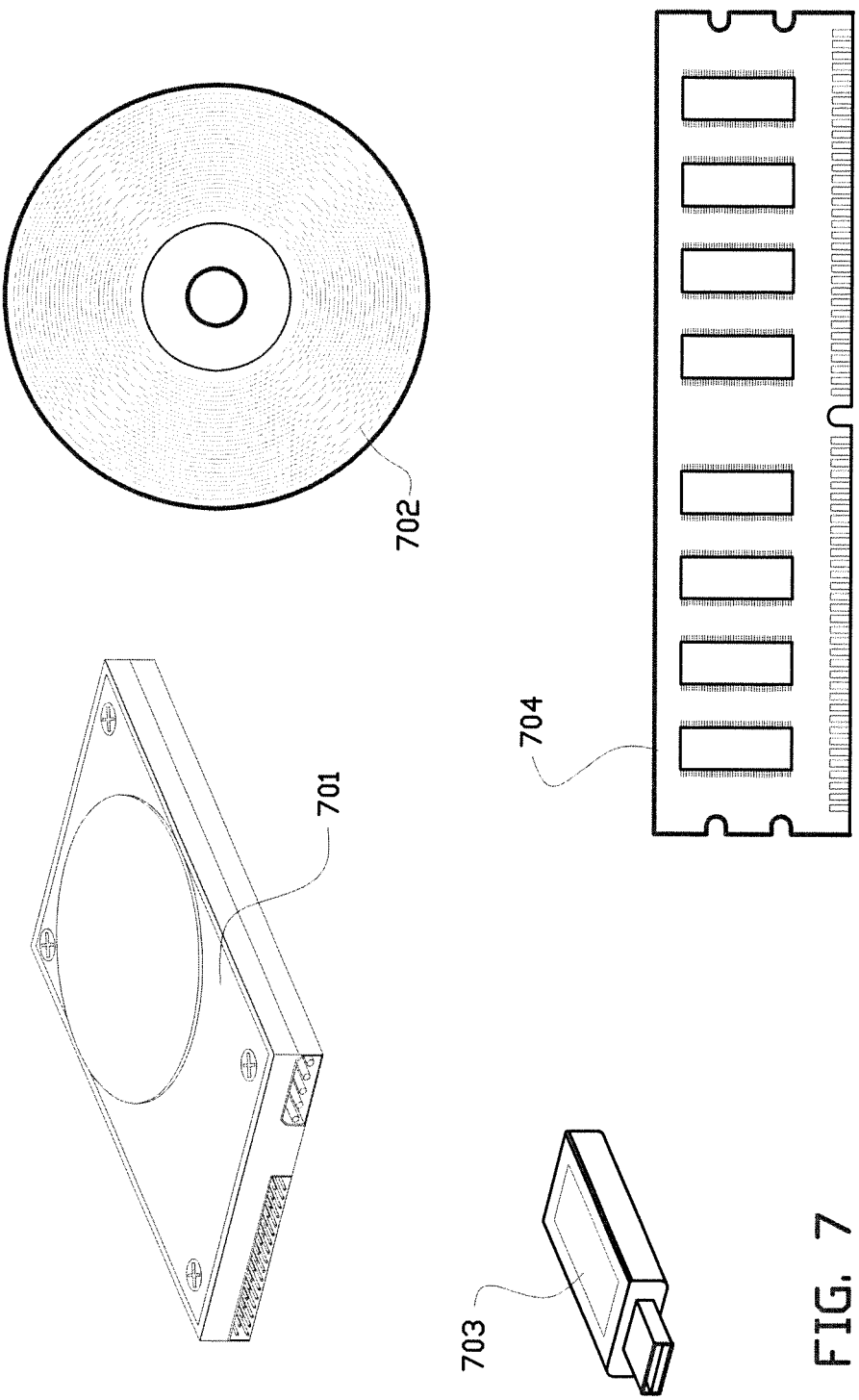
FIG. 7 shows examples of a computer readable medium according to the present invention.

FIG. 7 shows examples of computer readable media on which instructions for performing the method according to the invention may be stored, and/or on which a data structure according to the invention may be stored. The examples comprise a magnetic disc 701, an optical disc 702, a non-volatile memory 703 such as a flash drive, and a volatile memory 704, here comprising a bank of RAM chips. A corrected layout pattern may thus be calculated at a first location and stored on a computer readable medium, and the computer readable medium may subsequently be transported to a charged particle lithography system that uses the corrected layout pattern in order to pattern a target.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Method for performing a charged particle beam proximity effect correction process, said method comprising the steps of:
   receiving a digital layout of a pattern to be patterned onto a target using one or more charged particle beams;
   selecting a base proximity effect function comprising a sum of an alpha proximity effect function and a beta proximity effect function, wherein said alpha proximity effect function models a short range proximity effect and said beta proximity effect function models a long range proximity effect, wherein a constant $\eta$ is defined as a ratio between the beta proximity effect function and the alpha proximity effect function in said sum,
   characterized in that said method comprises the steps of:
   determining a modified proximity effect function corresponding to said base proximity effect function, wherein in said modified proximity effect function the alpha proximity effect function is replaced by a function which is invertible in the Fourier domain and has a frequency response over substantially the entire frequency range of the digital layout pattern; and
   using an electronic processor, performing a deconvolution of the digital layout pattern with the modified proximity effect function, and producing a corrected layout pattern based on said deconvolution.

2. Method according to claim 1, wherein said function which is invertible in the Fourier domain and has a frequency response over substantially the entire frequency range of the digital layout pattern is the Dirac delta function.

3. Data structure comprising a representation of a corrected layout pattern produced using a method according to claim 2.

4. Data structure according to claim 3, wherein said representation of said corrected layout pattern comprises a representation of the digital layout pattern and a separate representation of the background dose correction map.

5. Data structure according to claim 4, wherein said representation of the digital layout pattern comprises a number of polygons and associated dose values, and wherein said representation of the background dose correction map comprises a number of polygons and associated dose values to be superimposed on the digital layout pattern to form said corrected layout pattern.

6. Data structure according to claim 4, wherein said background dose correction map is represented as a number of adjacent and non-overlapping polygons having a size which is substantially larger than a smallest feature size in the digital layout pattern.

7. Method according to claim 1, wherein said performing a deconvolution results in calculation of background dose correction map which is dependent on a dose density distribution in the digital layout pattern, and wherein said corrected layout pattern is produced as a linear combination of said background dose correction map and said digital layout pattern.

8. Method according to claim 7, wherein said corrected layout pattern comprises corrected features corresponding to features in the digital layout pattern, wherein each corrected feature has boundaries substantially corresponding to boundaries of the corresponding feature in the digital pattern layout, and wherein the dose for said feature in the corrected pattern layout differs from the dose for the corresponding feature in the digital layout pattern by an amount based on said background dose correction map.

9. Method according to claim 1, wherein said digital layout is modelled as a layout pattern function p(x,y), wherein said alpha proximity effect function and said beta proximity effect function are sums of one or more Gaussian functions $g_\alpha(r)$ and $g_\beta(r)$ respectively, wherein $g_\alpha(r)$ and $g_\beta(r)$ are Gaussian functions with $\beta \gg \alpha$, and wherein $\alpha$ and $\beta$ can be substituted for $\sigma$ in $$g_\sigma(r) = \frac{1}{\pi\sigma^2} e^{\frac{-r^2}{\sigma^2}},$$

wherein r is the distance of a charged particle beam when incident on the resist to point (x,y),
said method comprising a step of calculating said background dose correction map as:

$$b(x, y) = p(x, y) \otimes (1 + \eta) \cdot s \sum_{n=1}^{N} \left((-\eta)^n g_{\beta\sqrt{n}}(r)\right) + c,$$

with s being a scaling constant, c being a constant offset and $\otimes$ being the convolution operator,
wherein producing said corrected layout pattern comprises calculating:

$$f_{n,c}(x,y) = p(x,y) \cdot (1+\eta) \cdot s + b(x,y).$$

10. Method according to claim 9, wherein s is substantially equal to $1/(1+\eta)$.

11. Method according to claim 9, wherein said constant c is dependent on a densest distribution of line shaped features that that may occur in said digital layout pattern and wherein the value of c is within the range $0.45 \cdot \eta/(1+\eta)$ to $0.55 \cdot \eta/(1+\eta)$.

12. Method according to claim 9, wherein said constant c is dependent on a densest distribution of contact shaped features that that may occur in said digital layout pattern wherein the value of c is within the range $0.30 \cdot \eta/(1+\eta)$ to $0.60 \cdot \eta/(1+\eta)$, preferably substantially equal to $0.45 \cdot \eta/(1+\eta)$.

13. Method according to claim 1, wherein a convolution of the modified proximity effect function with the digital layout pattern is substantially invertible.

14. Method according to claim 1, wherein said step of performing a deconvolution is carried out by calculating an approximation of said deconvolution, preferably using a Taylor expansion of the modified proximity effect function.

15. Method according to claim 1, further comprising a step of normalizing said corrected layout pattern.

16. Method according to claim 15, wherein said step of normalizing said corrected layout pattern comprises:
- determining a densest pattern of a specific feature that may occur in the digital layout pattern,
- determining an energy dose required for patterning a target with said specific features in a pattern corresponding to said densest pattern,
- adding a constant offset to said corrected layout pattern to produce an offset corrected layout pattern in which all values are greater than or equal to zero,
- scaling said offset corrected layout pattern so that features within said pattern which are arranged in a densest pattern have dosage of 100% and, features outside of said densest pattern have a higher dosage.

17. Method according to claim 1, comprising a step of, prior to producing said corrected layout pattern based on said deconvolution of the digital layout pattern with said modified proximity effect function, using an electronic processor to perform a short range proximity correction on said digital layout pattern.

18. Charged particle lithography system comprising an electronic processor adapted for performing the method according to claim 1 and/or for producing a corrected pattern layout pattern from a data structure comprising a representation of a corrected layout pattern.

19. Charged particle lithography system according to claim 18, further comprising
- a charged particle beam source for emitting a charged particle beam;
- an aperture array for splitting said beam into a multitude of charged particle beams;
- a beam blanker array adapted for individually blanking beams of said multitude of charged particle beams, for allowing said beams to completely or partially reach to target or not; and
- a controller, adapted for controlling said beam blanker array for blanking said beams based on the corrected layout pattern produced by said electronic calculator.

20. Computer readable medium, comprising instructions thereon for causing a computer to perform the method according to claim 1.

* * * * *